(12) United States Patent  (10) Patent No.: US 12,347,498 B2
Brandt et al.  (45) Date of Patent: Jul. 1, 2025

(54) DATA ERASE OPERATIONS FOR A MEMORY SYSTEM

(71) Applicant: Micron Technology, Inc., Boise, ID (US)

(72) Inventors: Kevin R. Brandt, Boise, ID (US); Adam J. Hieb, Meridian, ID (US); Jonathan Tanguy, Boise, ID (US); Preston A. Thomson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 206 days.

(21) Appl. No.: 17/943,139

(22) Filed: Sep. 12, 2022

(65) Prior Publication Data

US 2023/0005548 A1  Jan. 5, 2023

Related U.S. Application Data

(62) Division of application No. 17/074,758, filed on Oct. 20, 2020, now Pat. No. 11,443,811, which is a division of application No. 15/994,151, filed on May 31, 2018, now Pat. No. 10,854,299.

(51) Int. Cl.
*G11C 7/00* (2006.01)
*G11C 7/20* (2006.01)
*G11C 16/08* (2006.01)
*G11C 16/16* (2006.01)

(52) U.S. Cl.
CPC .............. *G11C 16/16* (2013.01); *G11C 7/20* (2013.01); *G11C 16/08* (2013.01)

(58) Field of Classification Search
CPC ............ G11C 16/16; G11C 7/20; G11C 16/08
USPC ........................................... 365/218
See application file for complete search history.

(56) References Cited

U.S. PATENT DOCUMENTS

| | | |
|---|---|---|
| 6,944,060 B2 | 9/2005 | Honda |
| 8,275,931 B2 * | 9/2012 | Yeh ..................... G06F 12/0246 711/115 |
| 8,843,691 B2 | 9/2014 | Calvert |
| 9,351,163 B2 | 5/2016 | Hunt et al. |
| 9,361,997 B2 | 6/2016 | Lee |
| 9,363,085 B2 | 6/2016 | Offenberg et al. |

(Continued)

FOREIGN PATENT DOCUMENTS

WO  2015021532  2/2015

*Primary Examiner* — Tha-O H Bui
(74) *Attorney, Agent, or Firm* — Brooks, Cameron & Huebsch, PLLC

(57) ABSTRACT

A data erase operation is performed on the memory system. The directed data erase operation performed on the memory system erases blocks of the memory device including blocks that are indicated as not including user data. In some embodiments, a data erase operation may be performed on a memory system to erase those groups of memory cells (e.g., blocks) indicated as not including user data. In some embodiments, a data erase operation may be performed on a memory system to erase those groups of memory cells (e.g., blocks) indicated as valid without erasing those groups of memory cells (e.g., blocks) indicated as invalid. In some embodiments, a data erase operation that can be performed on a memory system may obtain information associated with failing scenes of groups of memory cells (e.g., blocks) prior to obtaining the information, and erase the blocks (e.g., invalid blocks) subsequently.

20 Claims, 7 Drawing Sheets

(56) References Cited

U.S. PATENT DOCUMENTS

| | | |
|---|---|---|
| 9,489,297 B2 | 11/2016 | Peterson |
| 9,666,244 B2 * | 5/2017 | Hyun ..................... G11C 16/16 |
| 9,760,308 B2 * | 9/2017 | Kang ..................... G06F 3/0679 |
| 9,891,838 B2 * | 2/2018 | Woo ....................... G06F 3/0679 |
| 2007/0245067 A1 | 10/2007 | Yero |
| 2016/0013944 A1 | 1/2016 | Offenberg |
| 2016/0020319 A1 | 1/2016 | Laforet et al. |
| 2016/0055917 A1 | 2/2016 | Lee |
| 2019/0287599 A1 | 9/2019 | Higashi |

* cited by examiner

DATA ERASE OPERATIONS FOR A MEMORY SYSTEM

PRIORITY INFORMATION

This application is a Divisional of U.S. application Ser. No. 17/074,758, filed on Oct. 20, 2020, which will issue as U.S. Pat. No. 11,443,811 on Sep. 13, 2022, which is a Divisional of U.S. application Ser. No. 15/994,151, filed on May 31, 2018, now issued as U.S. Pat. No. 10,854,299, the contents of which are incorporated herein by reference.

TECHNICAL FIELD

The present disclosure relates generally to semiconductor memory devices, and, more particularly, to methods and apparatuses associated with data erase operations for a memory system.

BACKGROUND

A memory system can be a storage system, such as a solid-state drive (SSD), and can include one or more memory components that store data. For example, a memory system can include memory devices such as non-volatile memory devices and volatile memory devices. In general, a host system can utilize a memory system to store data at the memory devices of the memory system and to retrieve data stored at the memory system.

BRIEF DESCRIPTION OF THE DRAWINGS

The present disclosure will be understood more fully from the details description given below and from the accompanying drawings of various implementations of the disclosure.

DETAILED DESCRIPTION

Figure 1:
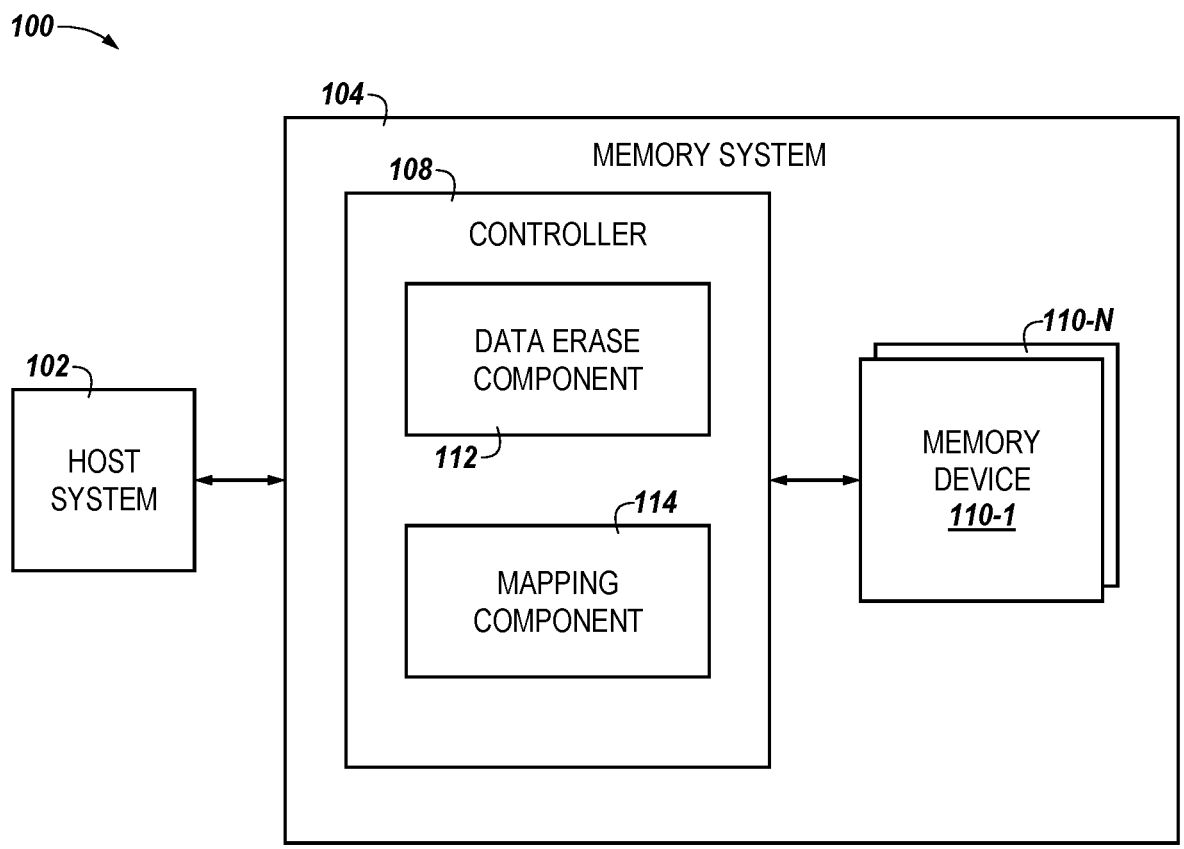
FIG. 1 illustrates an example computing system that includes a storage device, in accordance with some embodiments of the present disclosure.

Aspects of the present disclosure are directed to data erase operations for a memory system. The memory system can be a storage system, such as a solid-state drive (SSD). An SSD can include multiple interface connections to one or more host systems (hereinafter referred to as hosts). An SSD can be capable of performing a data erase operation, which is an execution of a command, for example, received from the host.

Data erase operations performed on the SSD may include secure erase and/or sanitization operations. Conventional secure erase/sanitization operations may result in an undesired consequence on information stored on the SSD unless directed otherwise. For example, the data erase operations may not erase those blocks that are erroneously indicated as not including user data (e.g., empty) although those blocks erroneously indicated as empty may include sensitive data. For example, the data erase operations may erase those blocks storing information desired to be still obtainable subsequent to the data erase operations.

Aspects of the present disclosure address the above and other deficiencies by providing a data erasure command that causes (e.g., direct) the SSD to perform data erase operations in a manner different than had the SSD not been directed. For example, the host-directed data erasure command provided to the SSD may cause the SSD to erase blocks that would not have been erased or not to erase (or delay erasing) blocks that would have been erased in the absence of the data erasure command of the present disclosure. As such, blocks, which are desired to be erased but would not have been erased in a conventional manner, may be securely erased because the SSD may be specifically directed to do so. Further, particular information (e.g., raw bit error rate (RBER) and/or information associated with threshold voltage distributions), which is desired to be obtained but would have been erased without being obtained in a conventional manner, may be preserved (e.g., obtained) because the SSD may be specifically directed not to erase and/or obtain the information prior to erasing those.

In some embodiments, a data erase operation may be performed on a memory system to erase those groups of memory cells (e.g., blocks) indicated as not including user data. In this example, those blocks that would not have been, in previous approaches, erased (e.g., as those blocks do not include user data) may be specifically directed to be erased.

In some embodiments, a data erase operation may be performed on a memory system to erase those groups of memory cells (e.g., blocks) indicated as valid without erasing those groups of memory cells (e.g., blocks) indicated as invalid. In this example, those blocks that would have been, in previous approaches, erased (e.g., invalid blocks) may be specifically directed to be not erased such that information associated with failing scenes of the invalid blocks are obtainable (e.g., preserved) subsequent to the data erase operation.

In some embodiments, a data erase operation that can be performed on a memory system may obtain information associated with failing scenes of groups of memory cells (e.g., blocks) prior to obtaining the information, and erase the blocks (e.g., invalid blocks) subsequently. In this example, those information that would have been, in previous data erase operations, lost (e.g., not obtained) may be obtained as a part of the data erase operation.

FIG. 1 illustrates an example computing system 100 that includes a storage device, in accordance with some embodiments of the present disclosure. An example of a memory system 104 is an SSD. The computing system 100 can include a host system, which is hereinafter referred to as host 102. A host 102 can be a host system such as a personal laptop computer, a desktop computer, a digital camera, a mobile telephone, or a memory card reader, among various other types of hosts. Computing system 100 includes a memory system 104 comprising controller 108 configured to perform data erase operations in accordance with some embodiments of the present disclosure. The host 102 can issue commands causing data to be written to the memory system 104 and/or read from the memory system 104.

The memory system 104 can include memory devices 110-1 to 110-N. In some embodiments, the memory devices 110-1 to 110-N may include non-volatile memory. For example, the memory devices 110-1 to 110-N may be NAND flash memory. Each of the memory devices 110-1 to 110-N may include one or more arrays of memory cells such as single level cells (SLCs), multi-level cells (MLCs), or quad-level cells (QLCs). Each of the memory cells may store bits of data (e.g., pages and/or blocks of data) used by the host system 102. Although non-volatile memory devices such as NAND flash memory are described, the memory devices 110-1 to 110-N may be based on any other type of memory. For example, the memory devices 110-1 to 110-N may be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, and electrically erasable programmable read-only memory (EEPROM). Furthermore, the memory cells of the memory devices 110-1 to 110-N may be grouped as memory pages or data blocks that may refer to a unit of the memory device used to store data.

The host 102 can be coupled to the memory system 104 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface may be used to transmit data between the host 102 and the memory system 104. The host 104 may further utilize an NVM Express (NVMe) interface protocol to access the memory devices 110-1 to 110-N when the memory system 104 is coupled with the host 102 by the PCIe interface.

The host 102 can issue one or more commands (e.g., read, write, erase, program, etc.) to the memory system 104. In some embodiments, the command issued from the host 102 to the memory system 104 may be a data erasure command that may direct how the memory system 104, responsive to receiving the data erasure command, performs a data erase operation on the memory device 110-1 to 110-N. As such, the data erasure command issued from the host may be a host-directed command.

The memory system 104 can include a controller 108 to communicate with the memory devices 110-1 to 110-N to perform operations such as reading data, writing data, or erasing data at the memory devices 110-1 to 110-N and other such operations. The controller 108 can include hardware such as one or more integrated circuits and/or discrete components, software such as firmware or other instructions, or a combination thereof. In general, the controller 108 can receive commands or operations from the host 102 and can convert the commands or operations into instructions or appropriate commands to achieve the desired access to the memory devices 110-1 to 110-N. The controller 108 can be responsible for other operations such as wear leveling operations, garbage collection operations, error detection and error-correcting code (ECC) operations, encryption operations, caching operations, and address translations between a logical block address and a physical block address that are associated with the memory devices 110-1 to 110-N.

The controller 108 can include a data erase component 112 to perform data erase operation as specifically directed by the data erasure command issued and received from the host 102. The data erase component 112 can perform a data erase operation that can erase blocks indicated as not including user data, not erase blocks marked as invalid (e.g., invalidated), and/or not erase blocks marked as invalid until particular information associated with the invalid blocks is obtained, as directed by the data erasure command received from the host 102. In some embodiments, the data erase operations performed on the memory device 110 may physically erase blocks of the memory device 110.

In some embodiments, the data erase component 112 can perform data erase operations by overwriting a particular data pattern to the blocks. For example, binary bit values of the particular data pattern may be all "1s", all "0s", and/or any combination of "1" and "0" in a random manner.

In some embodiments, performing data erase operations on blocks may include destroying readability of data stored on the blocks. In some embodiments, the particular data pattern may be overwritten to a portion of memory cells of the block, which can be sufficient to destroy a readability of data stored on the block. In some embodiments, if data stored on a block (e.g., block to be erased) is encrypted, a readability of the data may be destroyed by changing information associated with a corresponding encryption key, which may be stored on the same block and/or on a different block. In this example, the encrypted data stored on the block may not be erased (e.g., overwritten with a particular data pattern) and/or destroyed since the changed information associated with the corresponding encryption key would make it unable to read the data stored on the block.

Embodiments of the present disclosure can provide benefits such as preserving particular information associated with invalid blocks of the memory device 110. In previous approaches, erase operations performed in association with secure erase/sanitization destroyed (e.g., erased) invalid blocks such that the information that may be utilized in analyzing failing scenes of the invalid blocks is unobtainable. In contrast, embodiments of the present disclosure provide a deletion mechanism that preserves the information (e.g., data) associated with the failing scenes of invalid blocks, for example, even subsequent to performing data erase operations of the present disclosure.

In some embodiments, information associated with the failing scenes of invalid blocks that are obtainable can include, for example, information associated with threshold voltage distributions of the invalid blocks. For example, those invalid blocks may previously have experienced undesirable drift in threshold voltage distributions, which may have resulted in failures of memory operations performed on the blocks. As such, the information (e.g., threshold voltage distributions) obtained may be utilized to analyze failing scenes of the invalid blocks in connection with draft of the threshold voltage distributions.

The controller 108 can include a mapping component 114 that can include a logical to physical address map (e.g., table) as well as indicators of page status (e.g., valid, invalid, erased, etc.). The mapping component 114 can identify blocks that are currently invalid and/or blocks that were previously invalidated. In some embodiments, those blocks that are marked as invalid may be blocks whose reliability is adversely affected, for example, such that they are no longer in use for various memory operations.

The address map and/or page status can be updated in various manners. In some embodiments, the mapping can be initiated by host 102. For example, the host 102 may be configured to provide a trim command in association with providing a host-initiated data erasure command to the controller 108, which can initiate a data erase operation based on the LBA list provided from the trim command. As used herein, a trim command may be referred to as a command that informs the memory system 104 of which blocks of data are no longer considered in use (e.g., invalid blocks). For example, a trim command may be a TRIM command, UNMAP command, or DEALLOCATE command, among other commands, which can depend on a particular interface type and/or protocol (e.g., ATA, SCSI, etc.).

The mapping component 114 can update the table to mark a particular block as invalid, for example, responsive to a failure of a memory operation performed on the particular block of one or more of the memory devices 110-1 to 110-N. For example, the mapping component 114 may perform write operations on blocks of the one or more of the memory devices 110-1 to 110-N, determine that the write operation performed on a particular block failed, and update the table to mark that the particular block is invalid.

Blocks may be invalidated responsive to occurrence of various events that make the blocks unreliable. For example, a block may be invalidated responsive to a corresponding bit error rates (BER) exceeding a threshold BER. For example, a block may be invalidated when a memory operation failed to be performed on the block. In some embodiments, those blocks to be invalidated may be referred to as grown bad blocks (GBB).

Figure 2:
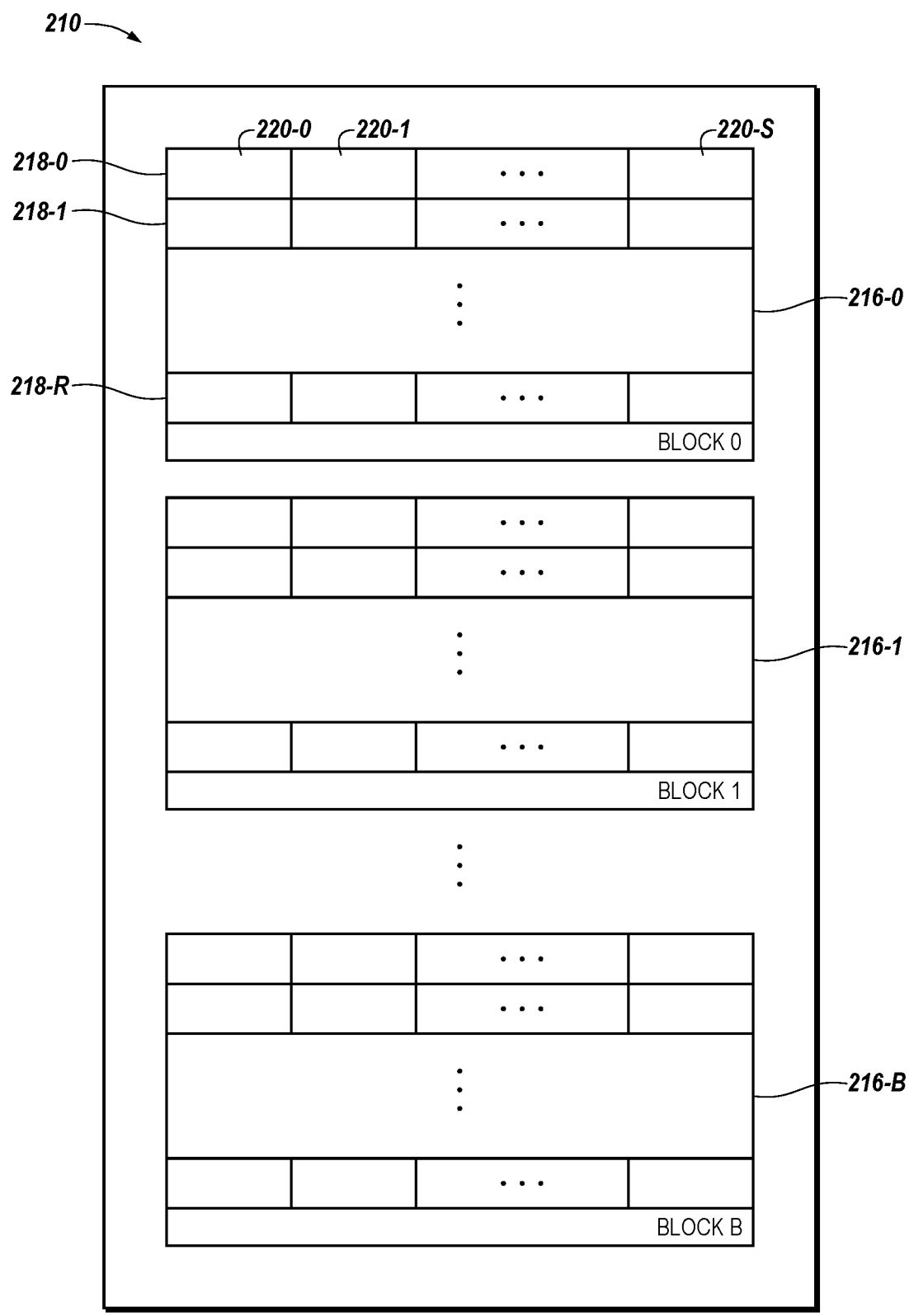
FIG. 2 illustrates an example memory device that includes physical blocks in accordance some embodiments of the present disclosure.

FIG. 2 illustrates a diagram of a portion of a memory device 210 having physical blocks 216-0 (BLOCK 0), 216-1 (BLOCK 1), . . . , 216-B (BLOCK B) in accordance with some embodiments of the present disclosure. The memory device 210 illustrated in FIG. 2 can be at least one of the memory device 110-1 to 110-N of FIG. 1. The memory device 210 can be, for example, a NAND flash memory. However, embodiments of the present disclosure are not limited to a particular type of memory or memory. For example, the memory device 210 can be a DRAM array, an RRAM array, or a PCRAM array, among other types of memory. Further, although not shown in FIG. 2, the memory device 210 can be located on a particular semiconductor die along with various peripheral circuitry associated with the operation thereof.

The blocks 216-0 (BLOCK 0), 216-1 (BLOCK 1), . . . , 216-B (BLOCK B) can be referred to collectively as blocks 216. The blocks 216 can comprise single level cells (SLCs) and/or multilevel cells (MLCs). As an example, the number of physical blocks 216 in the memory device 210 may be 128 blocks, 512 blocks, or 1,024 blocks, but embodiments are not limited to a particular number of physical blocks in the memory device 210.

Each block 216 can include memory cells that are erased together as a unit. As shown in FIG. 2, each physical block 216 can comprise physical rows 218-0, 218-1, . . . , 218-R of memory cells that can each be coupled to a respective access line (e.g., word line). The number of rows in each physical block can be 32, but embodiments are not limited to a particular number of rows 218 per physical block.

As one of ordinary skill in the art will appreciate, each row 218 can comprise physical pages of cells. A physical page of cells can refer to memory cells that are programmed and/or read together or as a functional group. In the embodiment shown in FIG. 2, each row 218 can comprise one physical page of cells. However, embodiments of the present disclosure are not so limited. For instance, each row 218 can comprise multiple physical pages of cells (e.g., an even page associated with cells coupled to even-numbered bit lines, and an odd page associated with cells coupled to odd numbered bit lines). Additionally, for embodiments including multilevel cells, a physical page can store multiple logical pages of data with each cell in a physical page contributing a bit toward a logical lower page, a bit toward a logical upper page, and one or more bits toward a respective number of logical intermediate pages.

In the example shown in FIG. 2, a physical page corresponding to a row 218 can store sectors 220-1, 220-2, . . . , 220-S of data (e.g., an amount of data corresponding to a host sector, such as 512 bytes). The sectors 220 may comprise user data as well as overhead data, such as error correction code (ECC) data and LBA data. It is noted that other configurations for the physical blocks 216, rows 218, and sectors 220 are possible. For example, rows 218 can each store data corresponding to a single sector which can include, for example, more or less than 512 bytes of data.

Figure 3A:
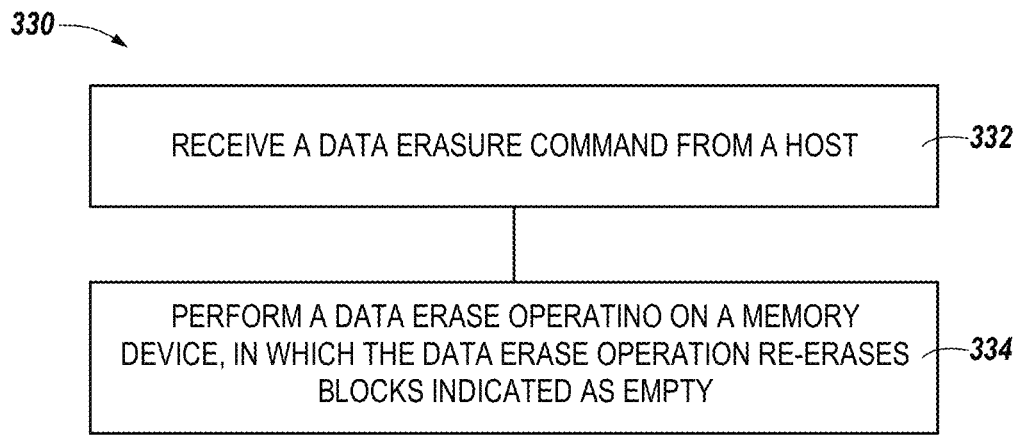
FIG. 3A illustrates a flow diagram of an example method to perform a data erase operation in accordance with some embodiments of the present disclosure.

FIG. 3A illustrates a flow diagram of an example method 330 to perform a data erase operation in accordance with some embodiments of the present disclosure. The method 330 may be performed by processing logic that may include hardware (e.g., processing device circuitry, dedicated logic, programmable logic, microcode, hardware of a device, integrated circuit, etc.), software (e.g., instructions run or executed on a processing device), or a combination thereof. In some embodiments, the method 330 may be performed by the data erase component 112 or one or more components of the controller 108 of FIG. 1.

At block 332, processing logic receives a data erasure command from a host. The command can be a request for the memory system to perform a data erase operation that can be specifically directed as to a manner in which the data erase operation is to be performed. As such, the data erasure command can be a host-initiated as well as a host-directed command. The memory system can be an SSD, for example, as described in FIG. 1.

At block 334, processing logic performs the data erase operation on a memory device. The memory device can be one or more of the memory devices 110-1 to 110-N of FIG. 1. The data erase operation performed on the memory device can include (e.g., result in) erasing blocks indicated as not including user data. For example, the data erase operation described in FIG. 3A can erase those blocks marked as "empty" as further described in connection with FIG. 3B-3C.

Figure 3B:
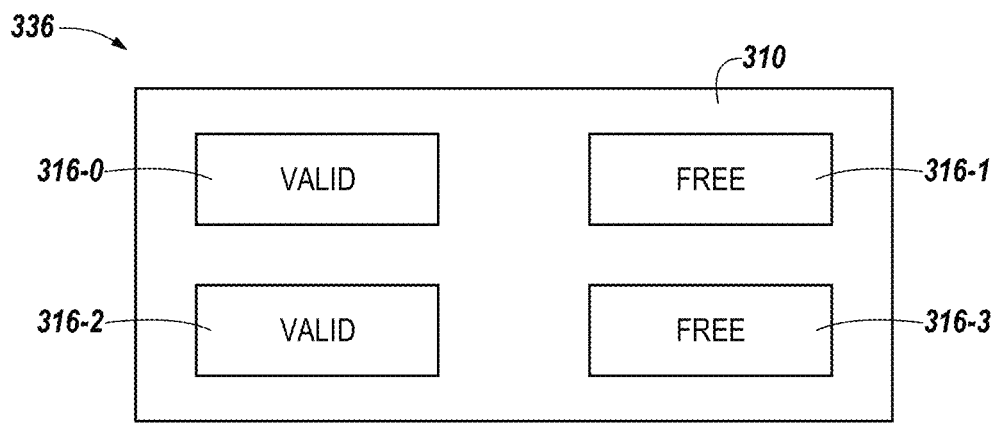
FIG. 3B-3C illustrate block diagrams of example statuses of a memory device illustrated in FIG. 3A.
Figure 3C:
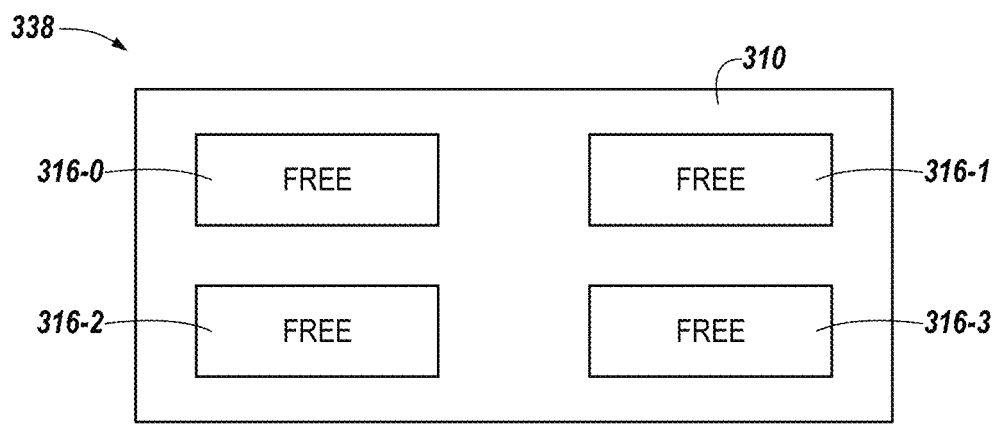

FIG. 3B-3C illustrate block diagrams of example statuses of a memory device illustrated in FIG. 3A. For example, FIG. 3B-3C illustrate status change of each example block of the memory device as the data erase operation described in connection with FIG. 3A is performed on the memory device 310.

Turning to FIG. 3B, FIG. 3B illustrates a block status 336 of the memory device 310, for example, prior to performing the data erase operation described in connection with FIG. 3A. For example, the data erase operation described in connection with FIG. 3B-3C on the memory device 310 may result in erasure of blocks of the memory device 310 indicated as not including user data.

The memory device 310 may include four different blocks 316-0, 316-1, 316-2, and 316-3 whose block statuses are illustrated in FIG. 3B. For example, as illustrated in FIG. 3B, the blocks 316-0 and 316-2 are illustrated as having "VALID" status, which indicates that the blocks 316-0 and 316-2 are still in use (e.g., by the host 102). For example, as illustrated in FIG. 3B, the blocks 316-1 and 316-3 are illustrated as having "FREE" status, which indicates that the blocks 316-1 and 316-3 do not include user data. Those blocks such as blocks 316-1 and 316-3 indicated as not including user data are empty blocks that were previously erased and to which data is not written prior to the data erase operation being performed. The blocks 316-0, 316-1, 316-2, and 316-3 may be collectively referred to as blocks 316.

Turning to FIG. 3C, FIG. 3C illustrates a block status 338 of the memory device 310, for example, subsequent to performing the data erase operation, as described in connection with FIG. 3A. The data erase operation performed on the memory device 310 may erase all blocks (e.g., blocks 316) of the memory device 310. For example, the blocks 316 of the memory device 310 erased as a result of the data erase operation include those "VALID" blocks 316-0 and 316-2 as well as those "FREE" blocks 316-1 and 316-3. As such, performing the data erase operation as described in connection with FIG. 3A-3C may result in re-erasing those blocks 316-1 and 316-3 indicated as not including user data.

The data erase operations as described in connection with FIG. FIG. 3B-3C provide benefits such as providing secure erasure on blocks that are erroneously indicated as not including user data. For example, the processing logic can utilize a table stored on the processing logic to identify invalid blocks, and the table may erroneously indicate that a particular block is an empty block while the particular block indeed includes user data. In previous approaches, those user data included in blocks that are erroneously indicated as invalid may not be securely erased as empty blocks are typically not re-erased in previous secure erase/sanitization operations. In contrast, the present disclosure provides a deletion mechanism that securely erase even those blocks that are indicated as empty to ensure that user data that may have been included in the empty blocks are also erased.

Figure 4A:
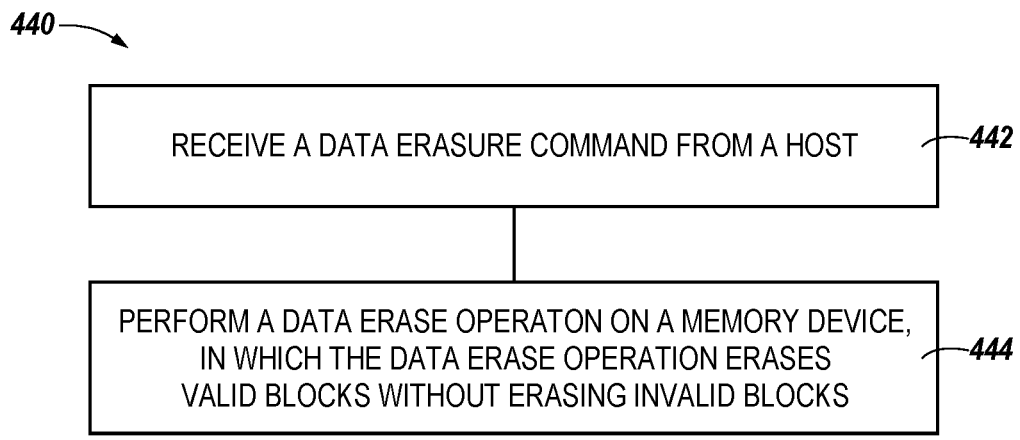
FIG. 4A illustrates a flow diagram of another example method to perform a data erase operation in accordance with some embodiments of the present disclosure.

FIG. 4A illustrates a flow diagram of another example method 440 to perform a data erase operation in accordance with some embodiments of the present disclosure. The method 440 may be performed by processing logic that may include hardware (e.g., processing device circuitry, dedicated logic, programmable logic, microcode, hardware of a device, integrated circuit, etc.), software (e.g., instructions run or executed on a processing device), or a combination thereof. In some embodiments, the method 330 may be performed by the data erase component 112 or one or more components of the controller 108 of FIG. 1.

Figure 4B:
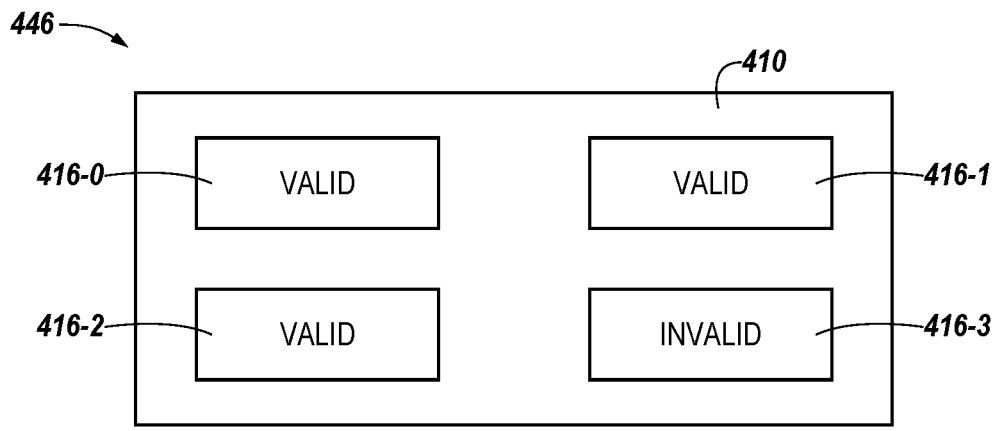
FIG. 4B-4C illustrate block diagrams of example statuses of a memory device illustrated in FIG. 4A.
Figure 4C:
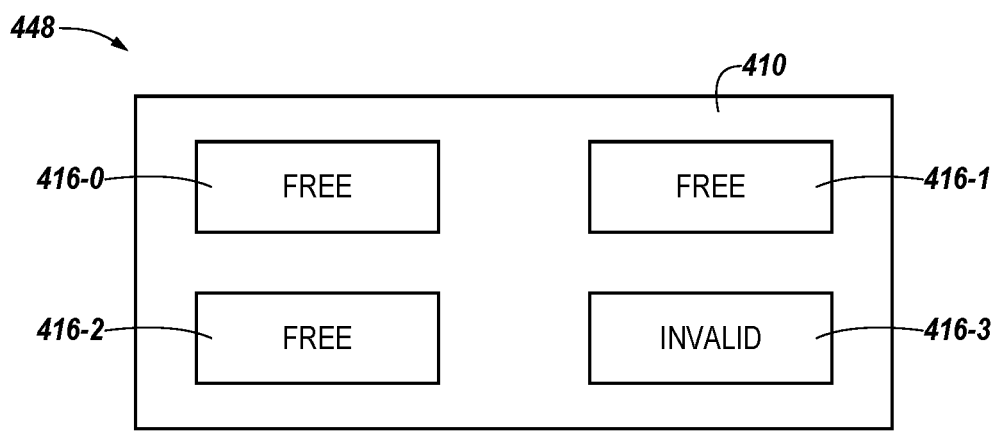

In some embodiments, the data erase operation performed in connection with FIG. 4A-4C on a memory system (e.g., memory system 104 of FIG. 1) may result in erasure of blocks indicated as valid without erasing blocks indicated as invalid such that information associated with failing scenes of the invalid blocks are obtainable subsequent to performing the data erase operation directed by the data erasure command of the present disclosure. In a number of embodiments, the data erasure command may be issued from a host (e.g., host 102 of FIG. 1) such that the host can enable/disenable performance of the data erase operation described in connection with FIG. 4A-4C.

At block 442, processing logic receives a data erasure command from a host. The command can be a request for the memory system to perform a data erase operation that can be specifically directed as to a manner in which the data erase operation is to be performed. As such, the data erasure command can be a host-initiated as well as a host-directed command. The memory system can be an SSD, for example, as described in FIG. 1.

In some embodiments, a data erase operation that may be specifically directed by the received data erasure command may erase blocks that are indicated as valid without erasing those blocks indicated as invalid. As such, the processing logic may identify, prior to performing the data erase operation, blocks that are currently invalid, the processing logic may be configured to update a table such that the table reflects which blocks of the memory device are currently invalid. The table update may be initiated by the host 102 of FIG. 1 via, for example, a trim command as described in connection with FIG. 1.

At block 444, processing logic performs the data erase operation on the memory device. The memory device can be one or more of the memory devices 110-1 to 110-N of FIG. 1. The data erase operation performed on the memory device results in erasure of "valid" blocks without erasing "invalid" blocks such that information associated with failing scenes of the "invalid" blocks are obtainable subsequent to the data erase operation performed.

FIG. 4B-4C illustrate block diagrams of example statuses of a memory device illustrated in FIG. 4A. For example, FIG. 4B-4C illustrate status change of each example block of the memory device as the data erase operation described in connection with FIG. 4A is performed on the memory device 410.

Turning to FIG. 4B, FIG. 4B illustrates a block status 446 of the memory device 410, for example, prior to performing the data erase operation described in connection with FIG. 4A. The memory device 410 may include four different blocks 416-0, . . . , 416-3 whose blocks statuses are illustrated in FIG. 4B. For example, as illustrated in FIG. 4B, the blocks 416-0, 416-1, and 416-2 are illustrated as having "VALID" status, which indicates that the blocks 416-0, 416-1, and 416-2 are still in use for memory operations (e.g., write, read, and/or erase). For example, as illustrated in FIG. 4B, the blocks 416-3 is illustrated as having "INVALID" status, which indicates that the block 416-3 is no longer in use for memory operations (e.g., write and/or read).

Turning to FIG. 4C, FIG. 4C illustrates a block status 448 of the memory device 410, for example, subsequent to performing the data erase operation. The data erase operation performed responsive to the data erasure command received from the host 102 erase those blocks marked as "VALID" and not erase those blocks marked as "INVALID." For example, as illustrated in FIG. 4C, the blocks 416-0, 416-1 and 416-2 are erased as a result of the data erase operation performed on the memory device 410, and their statuses are updated to be marked as "FREE." For example, as illustrated in FIG. 4C, the blocks 416-3 is not erased even subsequent to the data erase operation performed on the memory device 410. As such, its status remains as "INVALID."

The data erase operations as described in connection with FIG. 4A-4C provide benefits such as preserving information associated with failing scenes of invalid blocks. For example, the memory device 410 on which the data erase operations are performed may still include the information as the invalid blocks were not erased during the operations. As such, data stored on the invalid blocks may be obtainable at a later time such that the data (e.g., information associated with failing scenes) of the invalid blocks may be utilized in various ways, for example, such as in analyzing failing scenes of the invalid blocks.

Figure 5A:
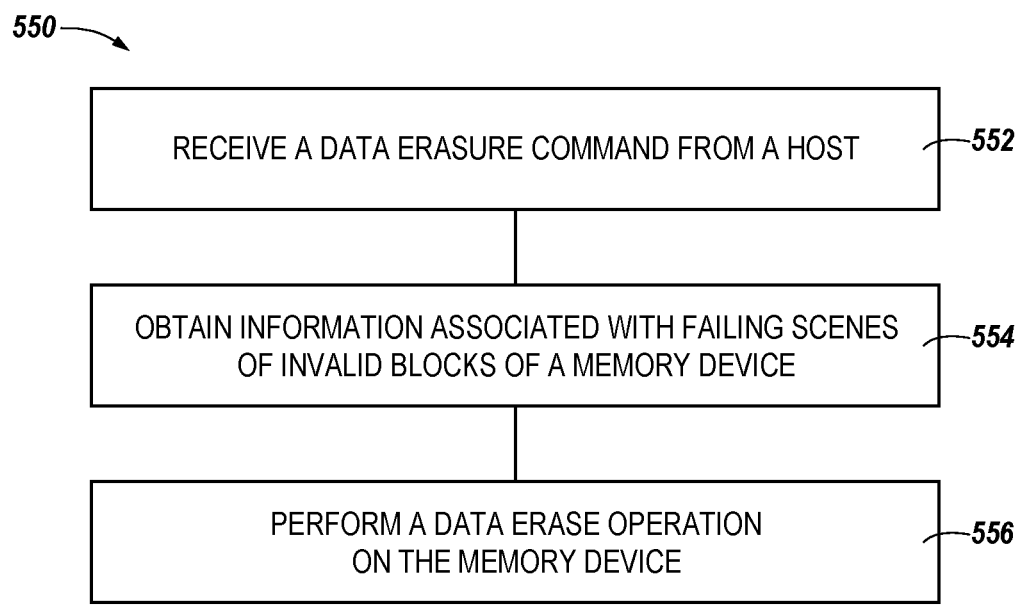
FIG. 5A illustrates a flow diagram of another example method to perform a data erase operation in accordance with some embodiments of the present disclosure.

FIG. 5A illustrates a flow diagram of another example method 550 to perform a data erase operation in accordance with some embodiments of the present disclosure. The method 560 may be performed by processing logic that may include hardware (e.g., processing device circuitry, dedicated logic, programmable logic, microcode, hardware of a device, integrated circuit, etc.), software (e.g., instructions run or executed on a processing device), or a combination thereof. In some embodiments, the method 330 may be performed by the data erase component 112 or one or more components of the controller 108 of FIG. 1.

At block 552, processing logic receives a data erasure command from a host. The command can be a request for the memory system to perform a data erase operation that can be specifically directed as to a manner in which the data erase operation is to be performed. As such, the data erasure command can be a host-initiated as well as a host-directed command. The memory system can be an SSD, for example, as described in FIG. 1.

In some embodiments, processing logic, responsive to receiving the data erasure command from the host, can identify blocks that are invalid among blocks of the memory device. To identify blocks that are "currently" invalid, the table may be updated responsive to receiving a data erasure command. As described in connection with FIG. 1, the table may, to identify the blocks that are "currently" invalid, be updated by the processing logic, for example, responsive to the trim command issued from the host.

At block 554, processing logic obtains information associated with failing scenes of invalid blocks of a memory device. The memory device can be one or more of the memory devices 110-1 to 110-N of FIG. 1. The processing logic may obtain the information of, for example, "currently" invalid blocks that may have been identified as described in connection with FIG. 1 and FIG. 4.

In some embodiments, the obtained information may be stored (e.g., relocated) in a particular location. For example, the information may be relocated to the host (e.g., host 102 in FIG. 1), processing logic (e.g., controller 108 in FIG. 1), and/or a different block within the same memory device (e.g., memory device 110 in FIG. 1). Further details of the relocation are described in connection with FIG. 5B-5D. Subsequent to obtaining the information, the method 560 can proceed to 556.

At block 556, processing logic performs the data erase operation on the memory device. In some embodiments, the data erase operation directed by the data erasure command from the host may erase blocks of the memory device including those blocks identified as "currently" invalid.

In some embodiments, the data erase operation directed by the data erasure command and performed on the memory device may erase other blocks as well as those blocks identified as currently invalid. The data erase operation may erase, for example, those blocks that are identified as valid and those blocks that are identified as empty.

Figure 5B:
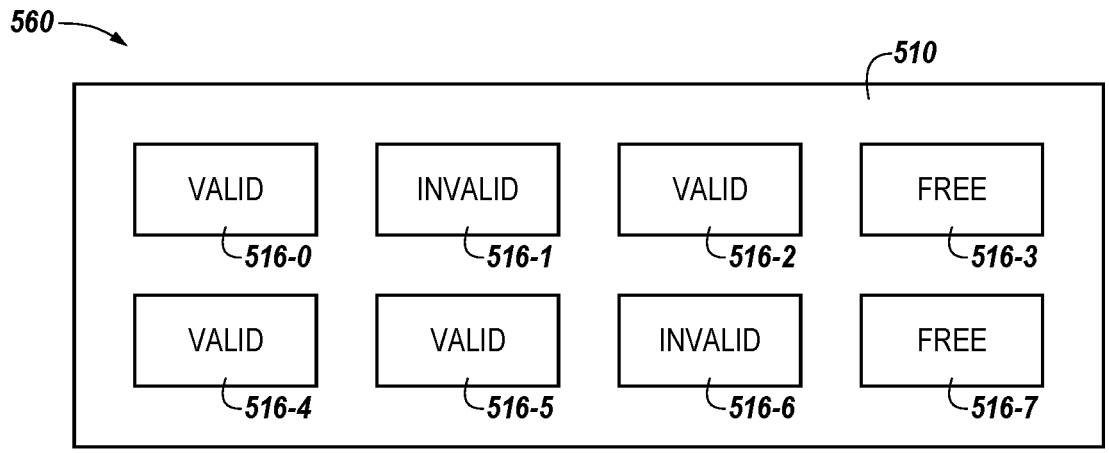
FIG. 5B-5D illustrate block diagrams of example statuses of a memory device illustrated in FIG. 5A.
Figure 5C:
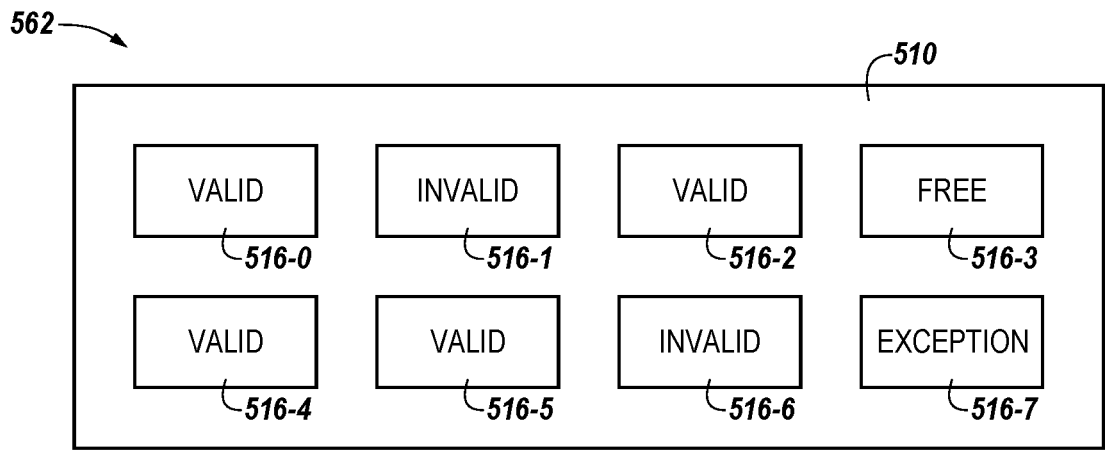
Figure 5D:
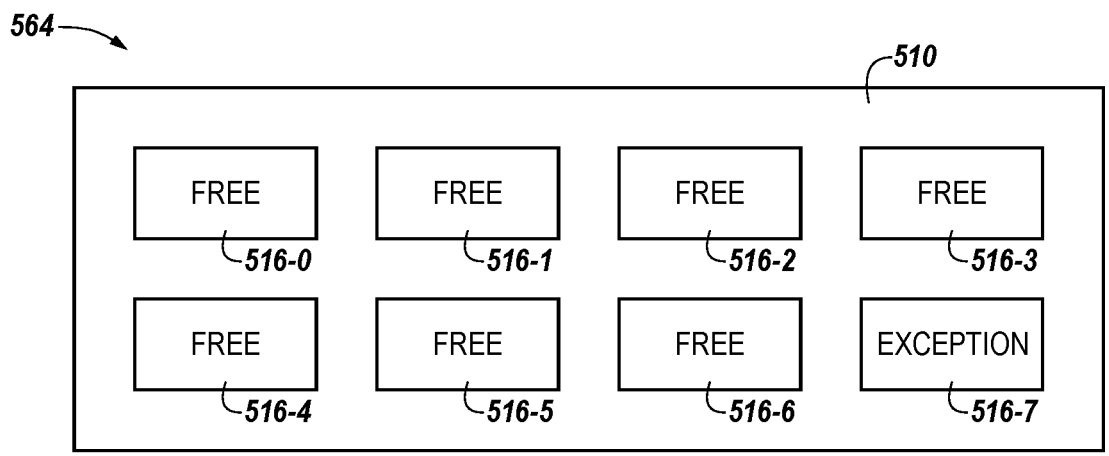
Figure 6:
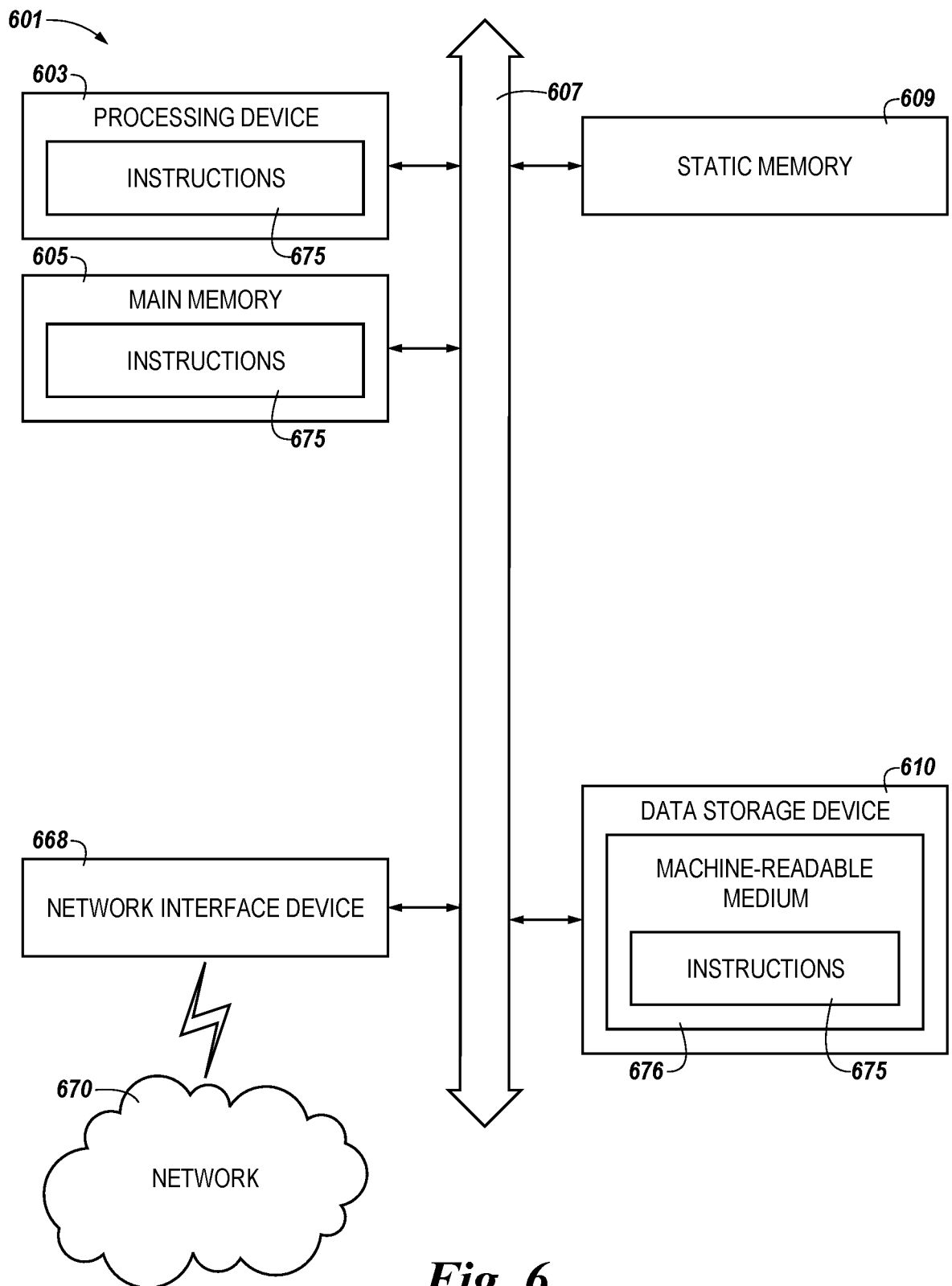
FIG. 6 is a block diagram of an example apparatus in the form of a computer system in which implementations of the present disclosure may operate.

In some embodiments, when the information associated with the failing scenes of the invalid blocks are stored within the memory device, the data erase operation may erase any block of the memory device except a particular block on which the obtained information is stored, as described further in connection with FIG. 5B-5D. The particular block can be at various locations within a memory system (e.g., memory system 104 of FIG. 1). For example, the particular block may be located on a memory device (e.g., memory device 110 of FIG. 1) of NAND flash memory. For example, the particular block may be located on a memory device of NOR flash memory.

FIG. 5B-5D illustrate block diagrams of example statuses of a memory device illustrated in FIG. 5A. For example, FIG. 5B-5D illustrate status change of each example block of the memory device as the data erase operation described in connection with FIG. 5A is performed on the memory device 510.

Turning to FIG. 5B, FIG. 5B illustrates a block status 560 of the memory device 510, for example, prior to performing the data erase operation described in connection with FIG. 5A. The memory device 510 may include eight different blocks 516-0, . . . , 516-7 whose block statuses are illustrated in FIG. 5B. For example, as illustrated in FIG. 5B, the blocks 516-0, 516-2, 516-4, and 516-5 are illustrated as having VALID status, which indicates that the blocks 516-0, 516-2, 516-4, and 516-5 are still in use for memory operations (e.g., write, read, and/or erase operations). For example, as illustrated in FIG. 5B, the blocks 516-1 and 516-6 are illustrated as having "INVALID" status, which indicates that the block 416-3 is no longer in use for the memory operations (e.g., read, write, and/or erase operations). For example, as illustrated in FIG. 5B, the blocks 516-3 and 516-7 are illustrated as having "FREE" status, which indicates that the blocks 516-3 and 516-7 do not include user data. Those blocks such as blocks 516-3 and 516-7 indicated as not including user data are empty blocks that were previously erased and to which data is not written prior to the data erase operation being performed.

Turning to FIG. 5C, FIG. 5C illustrates a block status 562 of the memory device 510, for example, subsequent to receiving a data erasure command. Responsive to receiving the data erasure command, the controller 108 may identify which blocks of the memory device 510 are invalid, and obtain, based on the identification information associated with failing scenes of invalid blocks (e.g., blocks 516-1 and 516-6). In some embodiments, the obtained information associated with failing scenes of invalid physical blocks 516-1 and 516-6 may be stored on various locations. In some embodiments, the information may be transferred from the memory device 510 to the controller 108 (e.g., as illustrated in FIG. 1) and/or to the host 102 such that a subsequent data erase operation performed on the memory device 510 erases all blocks of the memory device 510. In some embodiments, the obtained information may be stored on a particular location of the memory device 510. For example, as illustrated in FIG. 5C, the obtained information may be stored on one of the blocks 516-3 and 516-7 marked as "FREE" (e.g., empty). In an example as illustrated in FIG. 5C, the obtained information is stored on the empty block 516-3, and therefore, the controller 108 updates the table to mark the block 516-7 as "EXCEPTION", which indicates that the block 516-7 includes the information associated with the failing scenes, and not to be erased during the subsequent data erase operation.

Turning to FIG. 5D, FIG. 5D illustrates a block status 564 of the memory device 510, for example, subsequent to performing the data erase operation. As described in connection with FIG. 5A, the data erase operation may be performed subsequent to update the table to indicate that the block 516-7 includes the information associated with the failing scenes.

In an example illustrated in FIG. 5D, the data erase operation may erase all blocks of the memory device 510 except a particular block indicated as including the information associated with the failing scenes. For example, the date erase operation may erase those blocks 516-0, 516-2, 516-4, and 516-5 (e.g., at 562) marked as "VALID," those blocks 516-1 and 516-6 (e.g., at 562) marked as "INVALID," and the block 516-3 marked as FREE, and not erase the block 516-7 marked as "EXCEPTION." As such, subsequent to the data erase operation performed, the controller 108 may update a table to mark the erased blocks 516-0, 516-1, 516-2, 512-3, 516-4, 516-5, and 516-6 as FREE, which indicates that those blocks are empty while the block 516-7 remains being marked as EXCEPTION, which indicates that the block 516-7 includes the information associated with the failing scenes.

The data erase operations as described in connection with FIG. 5A-5D provides benefits such as securely erasing all blocks of a memory device while preserving information associated with failing scenes of invalid blocks. For example, the data erase operations performed on the memory device 510 securely erase all blocks (e.g., blocks 516) of the memory device 510 such that, the memory device 510 does not include user data subsequent to the data erase operations. At the same time, information associated with failing scenes of invalid data are still obtainable subsequent to the data operations as the information is still stored on a particular location (e.g., the memory device 510).

FIG. 4 illustrates an example machine of a computer system 400 within which a set of instructions, for causing the machine to perform any one or more of the methodologies discussed herein, may be executed. For example, the computer system 400 may correspond to a host system (e.g., the host system 120 of FIG. 1) that includes or utilizes a memory system (e.g., the memory system 110 of FIG. 1) or may be used to perform the operations of a controller (e.g., to execute an operating system to perform operations corresponding to the adaptive scan component 113 of FIG. 1). In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein. The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage device 418, which communicate with each other via a bus 430.

Processing device 402 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 402 may also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 may further include a network interface device 408 to communicate over the network 420.

The data storage device 418 may include a machine-readable storage medium 424 (also known as a computer-readable medium) on which is stored one or more sets of instructions or software 426 embodying any one or more of the methodologies or functions described herein. The instructions 426 may also reside, completely or at least partially, within the main memory 404 and/or within the processing device 402 during execution thereof by the computer system 400, the main memory 404 and the processing device 402 also constituting machine-readable storage media. The machine-readable storage medium 424, data storage device 418, and/or main memory 404 may correspond to the memory system 110 of FIG. 1.

The data storage device 610 can include a machine-readable storage medium 676 (also referred to as a computer-readable medium) on which is stored one or more sets of instructions 675 (e.g., software) embodying one or more of the various methodologies or functions described herein. The instructions 675 can also reside, completely or at least partially, within the main memory 605 and/or within the processing device 603 during execution thereof by the computer system 601, the main memory 605 and the processing device 603 also constituting machine-readable storage media. The machine-readable storage medium 676, data storage device 610, and/or main memory 605 can correspond to the memory system 104 of FIG. 1.

In one implementation, the instructions 426 include instructions to implement functionality corresponding to a programming component (e.g., adaptive scan component 113 of FIG. 1). While the machine-readable storage medium 424 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, aspects of the present disclosure may refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense.

What is claimed is:

1. A method, comprising:
   identifying one or more blocks indicated as empty as they were previously erased; and
   performing a data erase operation on a memory system by re-erasing the one or more blocks indicated as empty, while the one or more blocks are empty.

2. The method of claim 1, wherein performing the data erase operation on the memory system further comprises erasing a plurality of blocks of the memory system including:
   a plurality of first blocks indicated as including user data; and
   a plurality of second blocks indicated as not including user data.

3. The method of claim 1, wherein the blocks indicated as not including user data are empty blocks that were previously erased and to which data is not written prior to the data erase operation being performed.

4. The method of claim 1, wherein re-erasing the one or more blocks indicated as not including user data further comprises overwriting a particular data pattern to the one or more blocks indicated as not including user data.

5. The method of claim 1, wherein a data erasure command is received at a controller of a solid state drive, and wherein the controller is coupled to a host and the data erasure command is issued from the host to the controller.

6. An apparatus, comprising:
   an array of memory cells including a plurality of blocks; and
   a controller coupled to the array and configured to:
       receive a data erasure command;
       identify one or more blocks of the array indicated as empty as they were previously erased; and
       perform, in response to receipt of the data erasure command, a data erase operation on the one or more blocks of the array that are indicated as empty, while the one or more blocks are empty to result in re-erasure of the one or more blocks.

7. The apparatus of claim 6, wherein the controller is configured to mark, prior to performance of the data erase operation, the one or more blocks as a result of a previous data erase operation performed on the one or more blocks.

8. The apparatus of claim 6, wherein the controller is configured to overwrite a particular data pattern to the one or more blocks to perform the data erase operation on the one or more blocks.

9. The apparatus of claim 8, wherein the particular data pattern comprises a number of bits having a first binary value.

10. The apparatus of claim 8, wherein the particular data pattern comprises a combination of first and second binary values in a random manner.

11. The apparatus of claim 6, wherein the controller is further coupled to a host and the data erasure command is received from the host.

12. The apparatus of claim 6, wherein the blocks indicated as not including user data are empty blocks that were previously erased and to which user data is not written prior to the data erase operation being performed.

13. An apparatus, comprising:
    an array of memory cells including a plurality of blocks; and
    a controller coupled to the array and configured to:
        receive a data erasure command;
        identify one or more blocks of the array indicated as empty as they were previously erased and not including user data; and
        re-erase, as a result of performance of a data erase operation as directed by the data erasure command, the one or more blocks of the plurality of blocks that are indicated as empty, while the one or more blocks are empty.

14. The apparatus of claim 13, wherein the blocks indicated as not including user data are empty blocks that were previously erased and to which user data is not written prior to the data erase operation being performed.

15. The apparatus of claim 13, wherein the controller is configured to overwrite a particular data pattern to the one or more blocks to perform the data erase operation on the one or more blocks.

16. The apparatus of claim 15, wherein the particular data pattern comprises a number of bits having a first binary value.

17. The apparatus of claim 15, wherein the particular data pattern comprises a combination of first and second binary values in a random manner.

18. The apparatus of claim 13, wherein each block of the plurality of blocks of the array is a unit of erasure and is configured to store a plurality of pages of data.

19. The apparatus of claim 13, wherein the controller is configured to destroy, to perform the data erase operation, destroying a readability of the one or more blocks by changing information associated with an encryption key of an encryption key corresponding to the data stored in the one or more blocks.

20. The apparatus of claim 19, wherein the encryption key is stored in one of the one or more blocks.

* * * * *